United States Patent [19]

Allemandou et al.

[11] 4,184,132

[45] Jan. 15, 1980

[54] ELECTROMECHANICAL FILTERS

[75] Inventors: Philippe M. A. Allemandou, Ablons sur Seine; Didier M. C. Beaudet, Saint-Maur-des-Fosses, both of France

[73] Assignee: Societe Anonyme de Telecommunications, France

[21] Appl. No.: 918,797

[22] Filed: Jun. 26, 1978

[30] Foreign Application Priority Data

Jul. 1, 1977 [FR] France ................................. 77 20396

[51] Int. Cl.² .......................... H03H 9/26; H03H 9/02
[52] U.S. Cl. ..................................... 333/198; 333/197
[58] Field of Search .............................. 333/197–198, 333/186–190; 310/311, 321, 322, 328, 330–331, 25–26

[56] References Cited

U.S. PATENT DOCUMENTS

| | | | |
|---|---|---|---|
| 3,808,563 | 4/1974 | Borner et al. | 310/321 X |
| 4,130,812 | 12/1978 | Berniere | 333/197 |

Primary Examiner—Alfred E. Smith
Assistant Examiner—Marvin Nussbaum
Attorney, Agent, or Firm—Jacobs & Jacobs

[57] ABSTRACT

A pass-band electromechanical filter, comprising a mechanical unit vibrating in the longitudinal mode mounted between two electromechanical transducers, said unit comprising a plurality of half wave resonators mounted in series and coupling rods connecting the consecutive resonators, the resonators being distributed into two groups of which one comprises the resonators of odd rank and the other the resonators of even rank, the filter comprising moreover at least a bridging coupling rod connecting a resonator of rank k to a resonator of rank $k+(2p+1)$ (p being a positive integer different from zero), said bridging coupling rod having its ends fixed at a certain distance from the end faces of the resonators, at least the bridging coupling rod on the one hand, or the coupling rod placed between the resonator of rank k and that of rank $k+(2p+1)$ on the other hand, having a length which is respectively different from a three quarter wave or different from a quarter wave.

4 Claims, 7 Drawing Figures

ELECTROMECHANICAL FILTERS

The present invention relates to frequency electromechanical pass-band filters comprising a mechanical unit vibrating in longitudinal mode mounted between two electromechanical transducers, said unit comprising a plurality of half-wave resonators mounted in series and coupling rods connecting the consecutive resonators, the resonators being distributed into two groups of which one comprises the odd-rank resonators and the other the even-rank resonators.

In order to meet the practical requirements, the mechanical filters of such type comprise necessarily a large number of resonators, since they have no damping poles. As a large number of resonators corresponds to a high degree of the filter transmitter function, the group propagation time is large. This is very troublesome particularly in the field of digital transmissions.

In order to reduce the number of resonators, the filter has to be necessarily provided with damping poles, and this can be done, according to the theory, by providing at least one bridging coupling rod of quarter wave or three quarter wave length connecting a resonator of rank k to a resonator of rank $k+(2p+1)$ (p being a positive integer different from zero).

It is known for instance from French Pat. No. 2,290,788 how to insert bridging coupling rods in a mechanical filter with resonators vibrating in flexion. The German patent application No. 2,037,209 discloses on the other hand a mechanical filter with resonators vibrating in torsion, provided with bridging coupling rods.

The object of the invention is to provide a practical embodiment of a mechanical filter vibrating in a longitudinal mode and having damping poles.

With this in view, the filter of the aforementioned type comprising in addition at least one bridging coupling rod is characterized according to the invention in that said bridging coupling rod has its ends fixed at a certain distance of the end faces of the resonator, the bridging coupling rod at least on the one hand, or the coupling rods located between the resonator of rank k and that of rank $k+(2p+1)$ on the other hand, having a length which is respectively different from a three quarter wave or different from a one quarter wave.

The invention will become more apparent from the following description of one embodiment which is made with reference to the accompanying drawing wherein.

Figure 1:
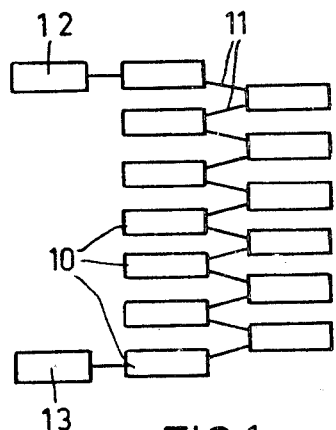
FIG. 1 shows a mechanical filter with a folded structure of known type.

There is shown in FIG. 1 a mechanical filter of conventional type with folded structure. The filter comprises in the embodiment represented thirteen resonators 10 forming half wave lines vibrating in a longitudinal mode and coupling rods 11 connecting the consecutive resonators, thereby forming quarter wave lines. Said filter is of the folded structure, viz. the resonators 10 are distributed into two rows and staggered, the couplers being arranged correspondingly. In known manner, the end resonators are connected to electromechanical transducers 12 and 13, for instance of the magnetostrictive type, which convert the electrical voltages into mechanical vibrations, and vice versa.

It should be noted in this respect that it is possible, advantageously, to use the magnetostrictive transducers as end resonators, the end coupling rods having then to be defined in consequence.

Figure 6:
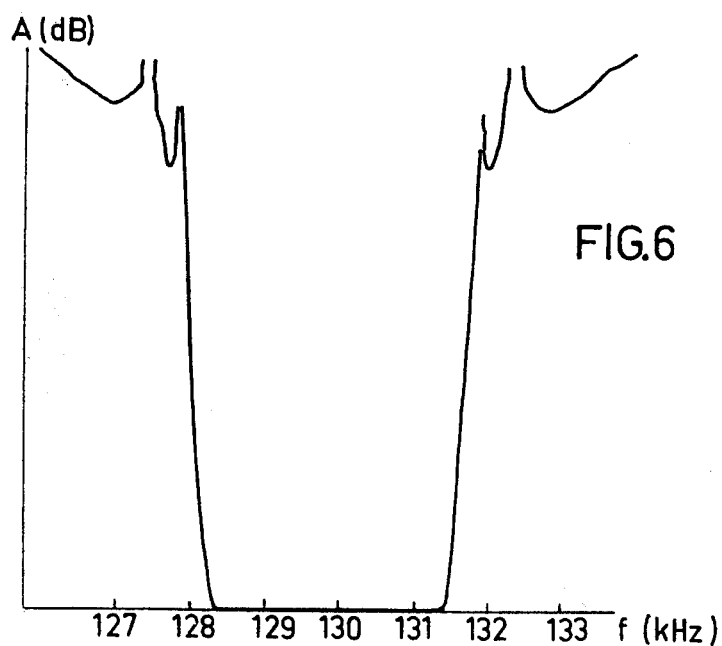
FIG. 6 shows the damping curve obtained with the filter of FIG. 3.

Such a filter has a group propagation time of the variation of which with the frequency, in the case of a pass-band comprised between 128 and 132 kHz, is shown by curve A in dotted line in FIG. 6. The minimum value of said time is of 1190 $\mu$s.

Figure 2:
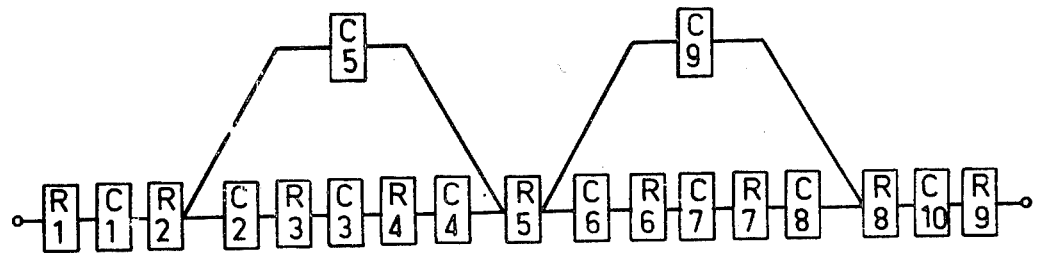
FIG. 2 shows schematically the structure of a damping pole filter.

FIG. 2 shows schematically a possible theoretical structure for a damping pole filter. In this diagram, the symbol R designates the resonators and the symbol C the coupling rods. Such a filter is distinguished over the filter of FIG. 1 in that bridging coupling rods C5 and C9 connect the central resonator 5 respectively with resonators R2 and R8. Each of the bridging coupling rods of a three quarter wave length supply two damping poles.

The structure shown in FIG. 2 is given only by way of example. Thus, one could as well provide a bridging coupling rod connecting the resonators R1 and R4 and another connecting the resonators R6 and R9.

Figure 3:
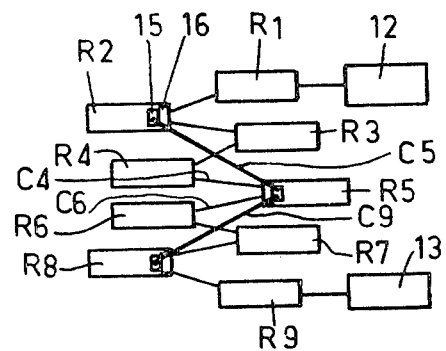
FIG. 3 shows a first embodiment of the invention.

FIG. 3 shows a practical implementation according to the invention of the theoretical principle defined hereabove.

In said filter, the couplers C2, C3, C4 and C6, C7, C8 connecting consecutive resonators are not quarter wave lines, but have lengths such that it is possible, from the geometrical view point, to connect resonator R5 to resonators R2 and R8 through three quarter wave bridging coupling rods.

As example, one may choose the following values for the normated lengths $\rho$ of the coupling rods (expressed as fractions of wave lengths): 0.25 for coupling rod C1, 0.35 for C2, 0.15 for C3 and 0.35 for C4, the length of the bridging coupling rod C5 being of 0.75. The lengths of coupling rods C6, C7, C8, C9, C10 have symmetrical values.

Figure 4:
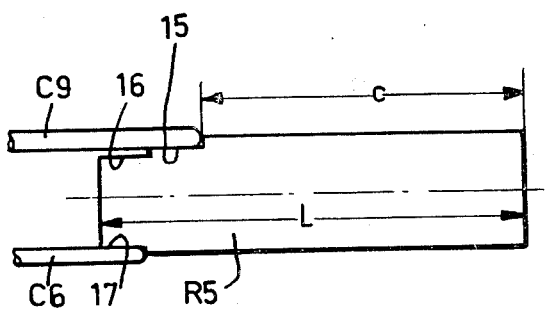
FIG. 4 is an enlarged elevation view of the central resonator of the filter of FIG. 3.

Moreover, and as is visible in FIG. 3 and in FIG. 4, the bridging coupling rods C5 and C9 have their ends fixed to the resonators R5 and R2 or R8 in points spaced apart from the end faces of said resonators.

For determining under such conditions the characteristics of the mechanical filter elements, one proceeds in the following manner:

Firstly, one determines the impedances and the theoretical lengths of the resonators and of the coupling rods which allow obtaining the required filtering characteristics. The impedances $Z_k$ and $Z_i$ are thereby respectively obtained for the resonators and the coupling rods, as well as the lengths $\rho_k$ and $\rho_i$.

On the other hand, and as explained hereabove, the lengths $\rho'_i$ which the coupling rods have to really assume are known.

Let us consider a mechanical doublet formed of two resonators of lengths k and k+1, connected by a coupling rod of rank i.

The impedances of the resonators are $Z_k$ and $Z_{k+1}$, that of the coupling rod is $Z_i$ and the lengths are $\rho_k$ and $p_{k+1}$ for the resonators, $p_i$ for the coupling rod. Knowing $p'_i$ (for instance 0.15 for C3 in FIG. 3), one may calculate the new characteristics $Z'_k$ and $Z'_{k+1}$, $p'_k$ and $p'_{k+1}$ and $Z'_i$ by means of the following relations where the impedances are supposed inversely proportional to the area of the cross section of the resonators or the coupling rods:

$$Z'_i = \frac{Z_i}{|\sin 2\pi'_i|}$$

$$\left.\begin{array}{l} p'_k = A_{k,1} \cdot p_k \\ Z'_k = A_{k,i} \cdot Z_k \\ p'_{k+1} = A_{k+1,i} \cdot p_{k+1} \\ Z'_{k+1} = A_{k+1,i} \cdot Z_{k+1} \end{array}\right\} \text{avec } A_{k,i} = $$

$$\left(1 - \frac{4p_k Z_k}{\pi Z_i} \cos 2\pi p'_i\right)^{-\frac{1}{2}}$$

Till now, it has been supposed that the coupling rods were fixed on the end faces of the resonators. This is not true for the bridging coupling rods C5 and C9 which, as has been indicated, have their ends fixed at a certain distance from the end faces of the resonators R5 and R2, R8. This arrangement leads to the introduction of a corrective factor in the impedance calculation, and this calculation shows that the area of the cross section of the bridging coupling rods has to be multiplied by a factor $$B = \frac{1}{\cos \frac{2\pi c}{L}}$$

where L is the length of the resonators and c the distance from the end of the coupling rod to the end face of the resonator opposed to the coupling rod (see FIG. 4).

This amounts to multiply the coupling rod diameter by factor $$\frac{1}{\cos \frac{\pi c}{L}}$$

Figure 5:
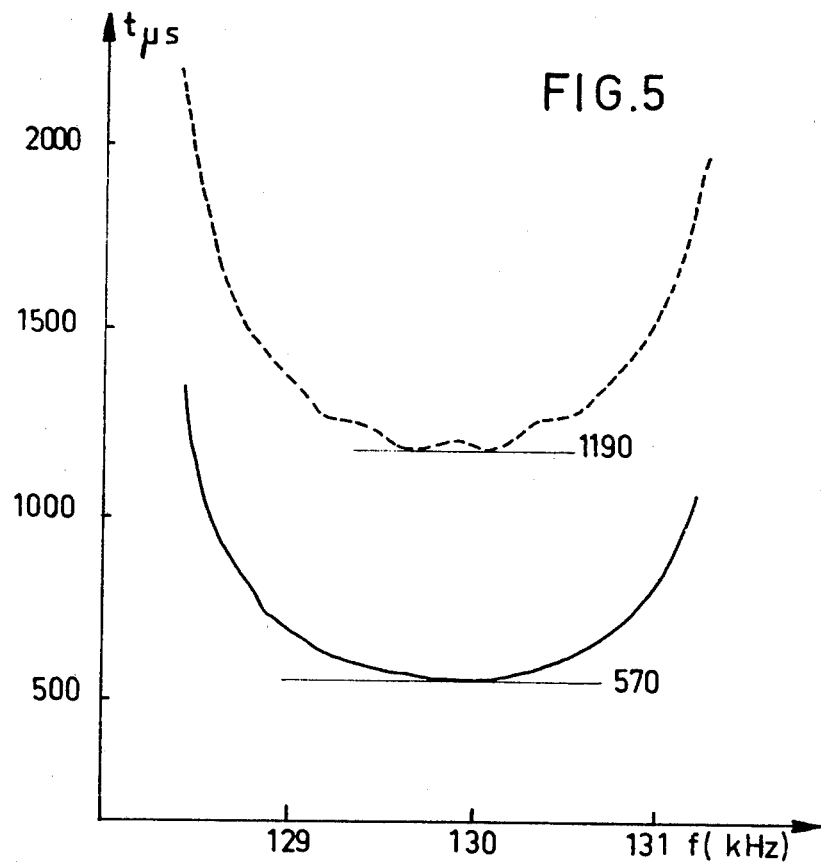
FIG. 5 shows the variation of the group propagation time as a function of the frequency obtained with the standard filter (curve A in dotted line) and with a filter of FIG. 3 as per the invention (curve B in solid line).

The filtering performance of such a filter is illustrated in FIGS. 5 and 6. The group propagation time is given by curve B in solid line of FIG. 5. Said time has a minimum value of 570 μs. It is therefore quite distinctly inferior to the minimum value found for the conventional filter of 1190 μs.

The damping curve is shown in FIG. 6, and shows the presence of two damping pole pairs substantially symmetrical relative to the central frequency. The latter being of 129,850 Hz, the values of 127,450 Hz and 127,850 Hz on the one hand and of 131,900 and 132,325 Hz on the other hand will be found.

It will be noted that the filter of FIG. 3 has characteristics superior to that of the conventional filter of FIG. 1 although it has only nine resonators instead of thirteen in the conventional filter without bridging coupling rods.

FIG. 4 provides more precisions as to how the coupling rods are fixed on the central resonator R5. The bridging coupling rods C5 and C9 of which the impedances Z have values substantially superior to the impedances of the other coupling rods are welded to a flat portion 15 which is continued by a recess 16. Thus, the bridging coupling rods do not contact the resonator outside the welding seam, thereby providing the possibility of defining with precision the welding seam length as well as the effective length of the coupling rod.

The coupling rods C4 and C6 connecting the resonator R5 to the adjacent resonators R4 and R6 are welded on a flat portion 17 provided on the opposite side of resonator. However, they could also be fixed to the end face of the resonator, by drilling a hole and brazing or welding them is said hole.

This arrangement has been described for resonator R5, but is the same for resonators R2 and R8, as is shown in FIG. 3.

Figure 7:
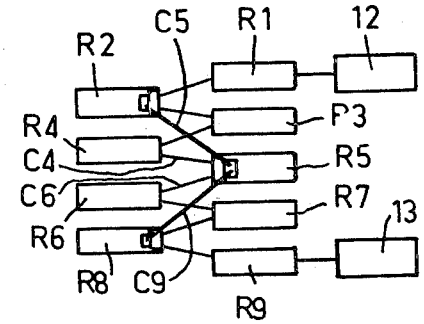
FIG. 7 shows another embodiment according to the invention.

FIG. 7 shows another possible embodiment of a filter according to the invention. In this case, the coupling rods connecting the consecutive resonators are all quarter wave lines ($p=0.25$), and the bridging coupling rods have a length slightly different than 0.75, for instance of $p=0.65$. The latter are fixed on the resonators in the same manner as in the case described with reference with FIG. 3.

The embodiments of FIGS. 3 and 7 are only limit examples, and all intermediate cases may be envisaged with at the same time bridging coupling rods of a length in the vicinity of 0.75 and an arrangement of the coupling rods such as is shown in FIG. 3.

What is claimed is:

1. A pass-band electromechanical filter, comprising a mechanical unit vibrating in the longitudinal mode mounted between two electromechanical transducers, said unit comprising a plurality of half wave resonators mounted in series and coupling rods connecting the consecutive resonators, the resonators being distributed into two groups of which one comprises the resonators of odd rank and the other the resonators of even rank, the filter comprising moreover at least a bridging coupling rod connecting a resonator of rank k to a resonator of rank k+(2p+1) (p being a positive integer different from zero), said bridging coupling rod having its ends fixed at a certain distance from the end faces of the resonators, at least the bridging coupling rod on the one hand, or the coupling rod placed between the resonator of rank k and that of rank k+(2p+1) on the other hand, having a length which is respectively different from a three quarter wave or different from a quarter wave.

2. The filter according to claim 1, wherein each resonator receiving a bridging coupling rod has a first end flat portion which is connected to a second shallower flat portion on which is welded said bridging coupling rod.

3. The filter according to claim 1, wherein at least one three quarter wave bridging coupling rod connects a resonator of rank k to the resonator of rank k+3, the coupling rod connecting the resonator of rank k+1 and that connecting the resonator of rank k+2 to the resonator of rank k+3 have a length superior to a quarter wave, whereas the coupling rod connecting the resonator of rank k+2 has a length inferior to a quarter wave.

4. The filter according to claim 1, wherein at least one bridging coupling rod with a length in the vicinity of a three quarter wave connects a resonator of rank k to a resonator of rank k+3, all the coupling rods connecting the consecutive resonators being quarter wave lines.

* * * * *